US007786484B2

(12) United States Patent
Kawashima

(10) Patent No.: US 7,786,484 B2
(45) Date of Patent: Aug. 31, 2010

(54) DISPLAY DEVICE HAVING A PORTION OF A PIXEL CIRCUIT EXPOSED BY A CONNECTION HOLE

(75) Inventor: Noriyuki Kawashima, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 12/144,747

(22) Filed: Jun. 24, 2008

(65) Prior Publication Data

US 2009/0008713 A1 Jan. 8, 2009

(30) Foreign Application Priority Data

Jul. 6, 2007 (JP) ............................. 2007-177991

(51) Int. Cl.
*H01L 27/14* (2006.01)
(52) U.S. Cl. ................. 257/72; 257/E27.121; 257/786; 362/249.05; 362/249.02; 349/143
(58) Field of Classification Search ................... 257/72, 257/E27.121, 786, 776; 362/249.02, 249.05; 349/143
See application file for complete search history.

(56) References Cited

U.S. PATENT DOCUMENTS

| | | | |
|---|---|---|---|
| 6,784,949 B1 * | 8/2004 | Nagata et al. | 349/39 |
| 7,301,597 B2 * | 11/2007 | Jeong et al. | 349/144 |
| 2006/0060897 A1 * | 3/2006 | Kuwazawa | 257/292 |
| 2006/0146260 A1 * | 7/2006 | Lee | 349/143 |

FOREIGN PATENT DOCUMENTS

| | | |
|---|---|---|
| JP | 2001-311960 | 11/2001 |
| JP | 2002-221917 | 8/2002 |
| JP | 2002-244576 | 8/2002 |
| JP | 2002244576 A * | 8/2002 |
| JP | 2004-334155 | 11/2004 |
| JP | 2005-055587 | 3/2005 |
| JP | 2005-115295 | 4/2005 |
| JP | 2006-295116 | 10/2006 |

OTHER PUBLICATIONS

Machine translation of JP 2002-244576 to Natori et al.*
A. Knobloch et al.; Fully printed integrated circuits from solution processable polymers; Journal of Applied Physics; 2004; vol. 96, p. 2286.

* cited by examiner

*Primary Examiner*—A. Sefer
*Assistant Examiner*—Allen L Parker
(74) *Attorney, Agent, or Firm*—Sonnenschein Nath & Rosenthal LLP

(57) ABSTRACT

A display device is provided which includes: pixel circuits for pixel electrode switching, arranged on a substrate; and an interlayer insulating film covering the pixel circuits. In this display device, the interlayer insulating film has connection holes which expose at bottom portions thereof connection portions of the pixel circuits, and connection portions of adjacent pixel circuits of the pixel circuits are exposed at the bottom portions of the connection holes. A method for manufacturing the above display device is also provided.

8 Claims, 7 Drawing Sheets

DISPLAY DEVICE HAVING A PORTION OF A PIXEL CIRCUIT EXPOSED BY A CONNECTION HOLE

CROSS REFERENCES TO RELATED APPLICATIONS

The present invention contains subject matter related to Japanese Patent Application JP 2007-177991 filed in the Japanese Patent Office on Jul. 6, 2007, the entire contents of which are incorporated herein by reference.

BACKGROUND OF THE INVENTION

1. Field of the Invention

The present invention relates to a display device and a method for manufacturing the same, and more particularly, relates to an active matrix display device including pixel circuits for pixel electrode switching and to a method for manufacturing the above display device.

2. Description of the Related Art

In recent years, attempts to develop a display device, such as electronic paper, having flexible properties have been made. In the display device as described above, organic thin film transistors (TFTs) formable on a plastic substrate by a low-temperature process are each used as a switching element which drives a pixel electrode. In addition, in order to reduce cost, a printing process has been intensively introduced in manufacturing of the display device as described above.

In manufacturing of a display device which includes organic TFTs, when photolithography for resist pattern formation and reactive ion etching using a resist as a mask are used, as the case of a silicon TFT, to form connection holes in an interlayer insulating film, due to damage caused by a developer and/or a stripper used for a resist, and plasma damage during reactive ion etching, transistor properties are liable to be degraded. Hence, in manufacturing of a display device including organic TFTs, in order to form an interlayer insulating film having connection holes, it has also been desired to use a printing process.

In addition, the display device as described above, which uses organic TFTs as switching elements, is necessary to satisfy a resolution of 150 dots per inch (dpi) or more. In this case, the size of one pixel is reduced to 200 µm square or less. Hence, a connection hole which connects a pixel circuit including a switching element to a pixel electrode provided thereabove with an interlayer insulating film interposed therebetween is necessary to have an opening diameter of 50 µm or less.

However, when an interlayer insulating film including connection holes each having an opening diameter of approximately 100 µm is formed by screen printing, the number of mesh intersections supporting an emulsion pattern of a 500-mesh screen plate, which is generally used, is only several. Hence, through repeated printing, printing defects caused, for example, by peeling of emulsion portions may occur. Furthermore, an interlayer insulating film including connection holes having an opening diameter of approximately 50 µm may not be practically formed by screen printing.

Accordingly, a method has been proposed in which via posts are printed beforehand at connection portions of pixel circuits, and an interlayer insulating film is then printed by a screen printing method or an inkjet method, and a method for manufacturing a display device using the above method has also been proposed (see Japanese Unexamined Patent Application Publication No. 2006-295116, and "Journal of Applied Physics" 2004, Vol. 96, p. 2286).

SUMMARY OF THE INVENTION

However, even by the above method in which after the via posts are printed, the interlayer insulating film is formed by printing, it is still difficult to form finer via posts. In addition, when a high viscous resin, which is suitable to form an interlayer insulating film having a large thickness, is printed in a state in which via posts are provided at a high density, it is difficult to form an interlayer insulating film having a flat surface. In addition, the degradation in surface flatness of an interlayer insulating film, as described above, degrades the surface flatness of a pixel electrode formed thereon, and as a result, color irregularity may occur.

Accordingly, it is desirable to provide a display device which includes an interlayer insulating film having a surface flatness even if it has a large thickness and being capable of disposing thereon by a printing method connection parts of a top and a bottom layer at a high density, and which can display a very fine image without causing color irregularity, and to provide a method for manufacturing the above display device.

According to an embodiment of the present invention, there is provided a display device which includes: pixel circuits for pixel electrode switching, arranged on a substrate; and an interlayer insulating film covering the pixel circuits. In particular, the interlayer insulating film has connection holes exposing at bottom portions thereof connection portions of the pixel circuits, and connection portions of adjacent pixel circuits of the pixel circuits are exposed at the bottom portions of the connection holes.

In the display device having the structure as described above, adjacent pixel circuits and respective pixel electrodes provided on the interlayer insulating film are independently connected to each other at each of the bottom portions of one connection holes. Hence, compared to the case in which one connection hole in which one pixel circuit and one pixel electrode are connected to each other is formed for one connection portion of the pixel circuit, connection holes each having a large opening diameter can be formed, and hence the margin of shape accuracy of the connection hole is increased.

In addition, in a method for manufacturing a display device, according to an embodiment of the present invention, first, pixel circuits for pixel electrode switching are formed to be arranged on a substrate. Subsequently, an interlayer insulating film having connection holes is formed, each connection hole exposing at a bottom portion thereof parts of adjacent pixel circuits of the pixel circuits.

In the manufacturing method as described above, since the process is used in which an interlayer insulating film having connection holes is formed on a substrate, compared to the case in which after via posts are formed to connect between pixel circuits and pixel electrodes, an interlayer insulating film is formed, an interlayer insulating film having a flat surface can be easily obtained by printing even if the film has a large thickness.

According to the embodiments of the present invention described above, the interlayer insulating film having a flat surface can be formed by a printing method even if it has a large thickness, and the margin of shape accuracy of the connection holes formed in this interlayer insulating film can be increased. Hence, fine connection parts between pixel circuits and respective pixel electrodes can be formed and arranged at a high density. As a result, a highly fine display

DESCRIPTION OF THE PREFERRED EMBODIMENTS

Hereinafter, the embodiments of the present invention will be described with reference to the drawings. In the following embodiments, the structure of a display device which is suitable for a liquid crystal display device and an electrophoretic display device will first be described, and subsequently, a method for manufacturing the above display device will be described.

First Embodiment

In this embodiment, an active matrix type display device will be described in which a bottom gate type thin film transistor is used as a switching element of a pixel electrode.

Circuit Structure

Figure 1:
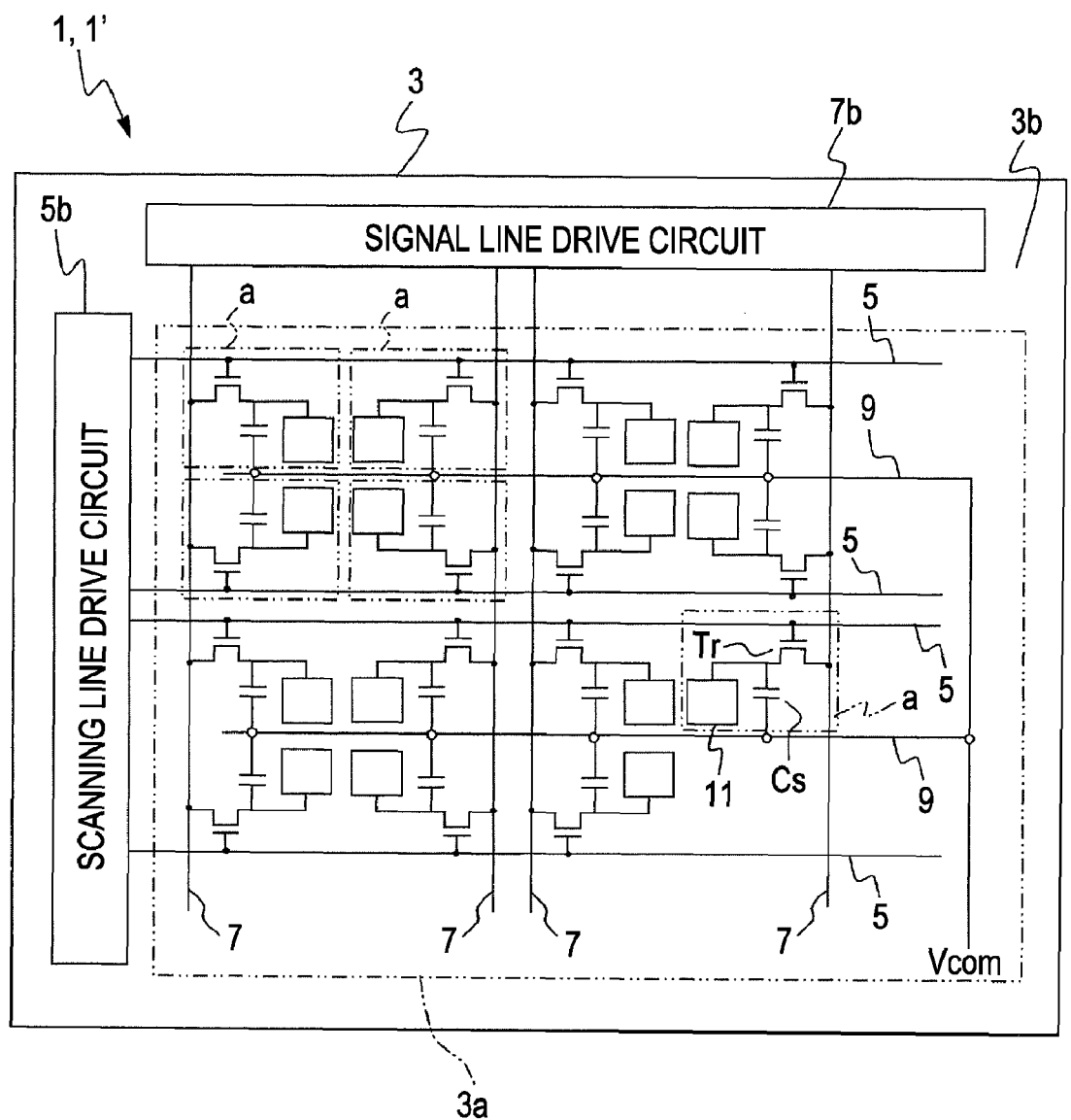
FIG. 1 is a view illustrating a circuit structure of a display device according to an embodiment of the present invention.

FIG. 1 is a view showing one example of a circuit structure of a display device 1 of the first embodiment of the present invention. First, with reference to FIG. 1, the circuit structure of the display device 1 will be described.

The display device 1 shown in the figure is, for example, a liquid crystal display device or an electrophoretic display device, and on a substrate 3 at a drive side, a display region 3a and a peripheral region 3b are defined. In the display region 3a, scanning lines 5 and signal lines 7 are disposed in a lateral and a longitudinal direction, respectively, and at a place corresponding to each of the intersections therebetween, a pixel array portion including one pixel a is provided. In addition, in the display region 3a, common lines 9 are provided in parallel to the scanning lines 5. On the other hand, in the peripheral region 3b, a scanning line drive circuit 5b which scan-drives the scanning lines 5 and a signal line drive circuit 7b which supplies an image signal (that is, an input signal) to the signal lines 7 in accordance with luminance information are disposed.

In each pixel a, for example, a pixel circuit including a storage capacitance Cs and a thin film transistor Tr functioning as a switching element is provided, and in addition, a pixel electrode 11 connected to this pixel circuit is also provided. In addition, the pixel electrode 11 is formed on an interlayer insulating film which covers the pixel circuits as will be described in detail with reference to a plan view and cross-sectional views.

The thin film transistor Tr is, for example, an organic TFT, the gate thereof is connected to one scanning line 5, the source or the drain is connected to one corresponding signal line 7, and the remaining source or drain is connected to one electrode of the storage capacitance Cs and the pixel electrode 11. In addition, the other electrode of the storage capacitance Cs is connected to one common line 9. The common lines 9 are connected to a common electrode provided at a counter substrate side which is not shown in the figure.

The structure is formed so that an image signal written from the signal line 7 is stored in the storage capacitance Cs via the thin film transistor Tr, and that a voltage corresponding to the stored signal amount is supplied to the pixel electrode 11.

In the circuit structure as described above, the pixel circuits of the pixels a are arranged in line symmetry with respect to the scanning lines 5 and, in more particular, are arranged in line symmetry with respect to directional lines parallel to the scanning lines 5. Furthermore, the pixel circuits of the pixels a are arranged in line symmetry with respect to the signal lines 7. In more particular, the pixel circuits are arranged in line symmetry with respect to directional lines parallel to the signal lines 7.

Accordingly, the connection portion between the pixel electrode 11 and the pixel circuit of each pixel a is designed to be disposed at the center between pixels a adjacent in a scanning line 5 direction and at the center between pixels a adjacent in a signal line 7 direction. In addition, two pixels a provided between two scanning lines 5 use one common line 9, and hence, the number of the common lines 9 can be decreased to one half of that generally formed. In this embodiment, the pixel circuits may be arranged so that the connection portions, each formed of the pixel electrode 11 and the pixel circuit, are disposed at the center between the adjacent pixels a, and so that as long as the members, such as the electrodes, disposed in the pixels a are in line symmetry with respect to the scanning line 5 and the signal line 7, the sizes and the positions of the above members may be changed.

The structure of the pixel circuit described above is merely one example, and whenever necessary, a capacitance element may be further provided in the pixel circuit, or further, a plurality of transistors may be provided to form a pixel circuit. In addition, in the peripheral region 3b, in accordance with the change of the pixel circuit, a necessary drive circuit may be additionally provided.

Layer Structure

Figure 2:
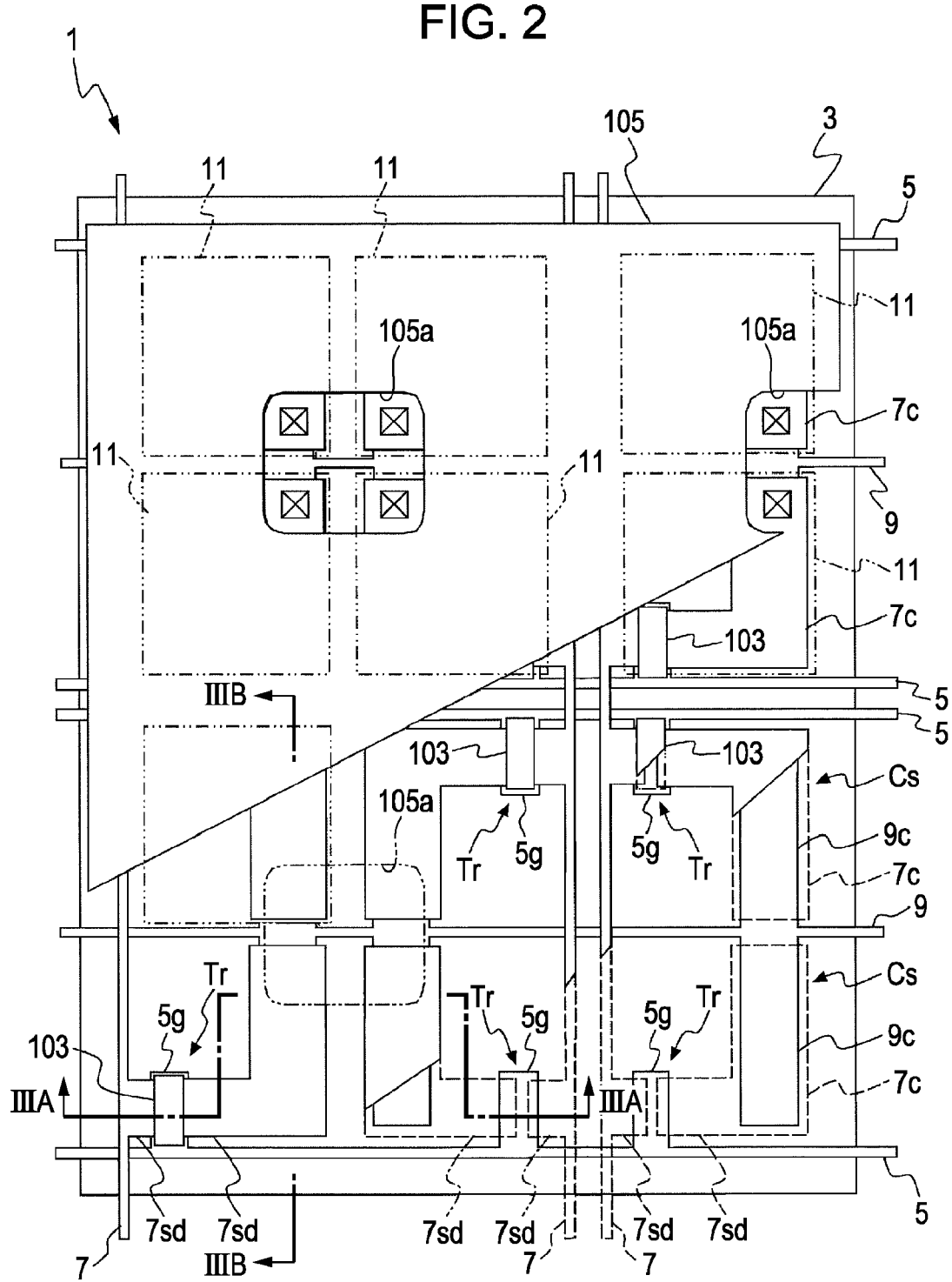
FIG. 2 is a plan view illustrating a layer structure of the display device according to the first embodiment of the present invention.
Figure 3A:
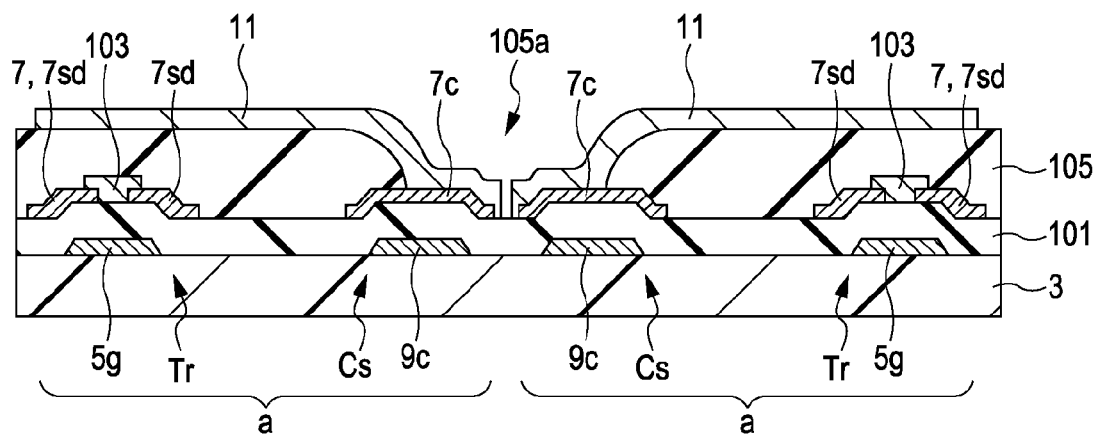
FIGS. 3A and 3B are cross-sectional views each illustrating the layer structure of the display device according to the first embodiment of the present invention.
Figure 3B:
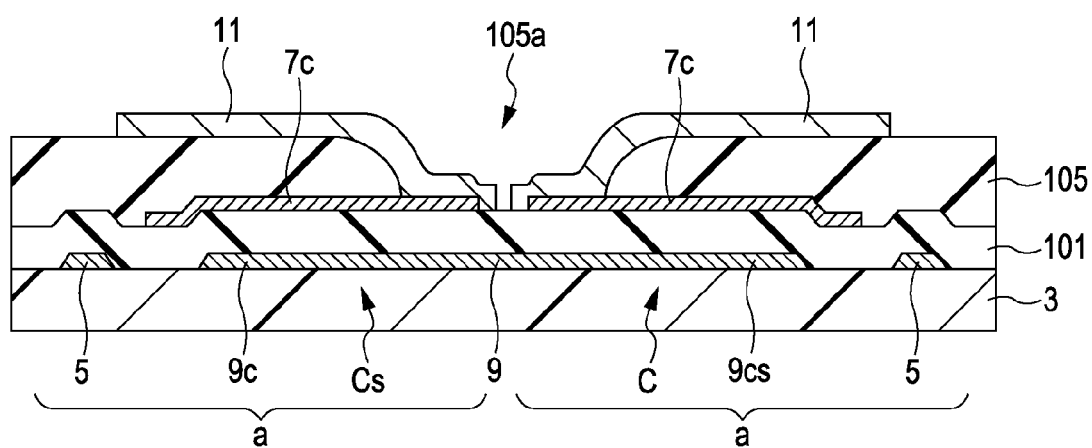

FIG. 2 is a plan view showing important portions of the display device 1 according to the first embodiment, FIG. 3A is a cross-sectional view taken along the line IIIA-IIIA in FIG. 2, and FIG. 3B is a cross-sectional view taken along the line IIIB-IIIB in FIG. 2. Hereinafter, with reference to the figures, the layer structure of the display device 1 will be described. In this embodiment, by way of example, a layer structure will be described in which pixels a each having a size of approximately 170 μm square are formed so as to be arranged at 150 dpi.

As shown in these figures, as a first layer provided on the substrate 3 at the drive side, the scanning lines 5 and the common lines 9 are provided parallel to each other. These lines 5 and 9 form a plurality of sets each including three lines, that is, two scanning lines 5 and one common line 9 provided therebetween.

From each scanning line 5, in each pixel a portion, a gate electrode 5g of the thin film transistor Tr is extended toward the common line 9 side. In addition, lower electrodes 9c of the capacitor elements Cs of individual pixel a portions are extended from each common line 9 to two scanning lines 5 located at the two sides thereof. That is, from one common line 9, the lower electrodes 9c are extended to two pixels a which are provided between the two scanning lines 5.

A gate insulating film 101 (shown only in a cross-sectional view) is provided so as to cover the scanning lines 5 and the common lines 9 described above.

As a second layer provided on this gate insulating film 101, the signal lines 7, sources 7sd and drains 7sd of the thin film transistors Tr, and upper electrodes 7c of the capacitor elements Cs are provided. One of the source 7sd and the drain 7sd of the thin film transistor Tr in each pixel a portion is extended from the signal line 7. In addition, the remaining source or drain 7sd and the upper electrode 7c form a continuous pattern in each pixel a portion.

In this embodiment, one of the source 7sd and the drain 7sd, which is extended from the signal line 7, is extended toward the inside between two signal lines 7. On the other hand, the remaining source or drain 7sd forming a continuous pattern with the upper electrode 7c is to be connected to a central portion between four pixels a, which use one common line 9, at a place between the two signal lines 7. The continuous pattern of the upper electrode 7c and the remaining source or drain 7sd is a connection portion with the pixel electrode 11 which will be described later.

As described above, in this first embodiment, the continuous pattern of the upper electrode 7c of the capacitor element Cs and the source or drain 7sd connected thereto, which is used as the connection portion with the pixel electrode 11, is disposed at the central portion between the four pixels a.

In addition, in each pixel a, a semiconductor layer 103, which is to be used as an active region of the thin film transistor Tr, is provided between the source 7sd and the drain 7sd at a position corresponding to that at which the gate electrode 5g is provided.

In addition, an interlayer insulating film 105 is provided so as to cover the pixel circuits described above. This interlayer insulating film 105 is preferably formed to have a large thickness so as not to generate a parasite capacitance between the pixel circuits and the pixel electrodes formed thereabove and so as to have a surface flatness.

In particular, connection holes 105a each located on four pixels a are provided in this interlayer insulating film 105. At the bottom portion of each connection hole 105a, as described above, the four upper electrodes 7c disposed at the central portion between the four pixels a are exposed as parts of adjacent pixel circuits. That is, in one connection hole 105a, the upper electrodes 7c forming the pixel circuits of the four pixels a are exposed.

The connection hole 105a may be formed so as to ensure connection to the upper electrodes 7c, and when the pixel opening is taken into consideration, the opening area (opening shape) is preferably decreased as small as possible. For example, in this case in which the pixel a is designed to have a size of approximately 170 μm square, the connection hole 105a may be formed to have an opening diameter of approximately 110 to 130 μm.

As a third layer provided on this interlayer insulating film 105, the pixel electrodes 11 are formed and arranged. One pixel electrode 11 is directly connected to the corresponding upper electrode 7c forming the pixel circuit at the bottom portion of the connection hole 105a provided in the interlayer insulating film 105. Hence, in one connection hole 105a, end portions of four pixel electrodes 11 are directly connected to the respective upper electrodes 7c. Since the gate insulating film 101 is provided between the upper electrodes 7c and the common lines 9, the insulation between the pixel electrodes 11 and the common lines 9 can be ensured.

For example, in the case of a liquid crystal display device, the pixel electrodes 11 described above are covered with an alignment film which is not shown in the figures.

In addition, a counter substrate (not shown in the figures) is provided at one side of the drive-side substrate 3 at which the pixel electrodes 11 are formed. On a surface of the counter substrate facing the pixel electrodes 11, a common electrode common for all the pixels is provided. In addition, for example, in the case of a liquid crystal display device, an alignment film is provided to cover the common electrode, and between the pixel electrodes 11 and the common electrode provided on the two substrates, a liquid crystal layer (for example, polymer dispersion type liquid crystal) is provided with the alignment films each in contact therewith. In addition, in the case of an electrophoretic display device, between the pixel electrodes 11 and the common electrode, microcapsules in which charged graphite fine particles and titanium oxide fine particles are dispersed in silicone ions are provided.

Manufacturing Method

Figure 4A:
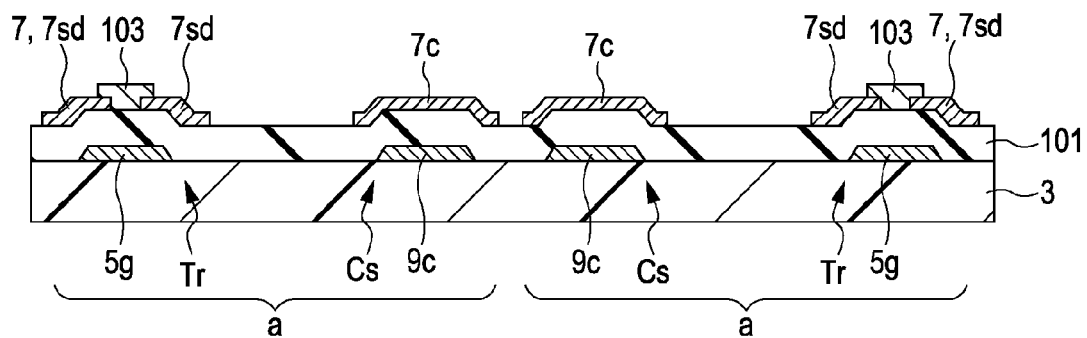
FIGS. 4A to 4C are cross-sectional views each illustrating a manufacturing step of the display device according to the first embodiment of the present invention.
Figure 4B:
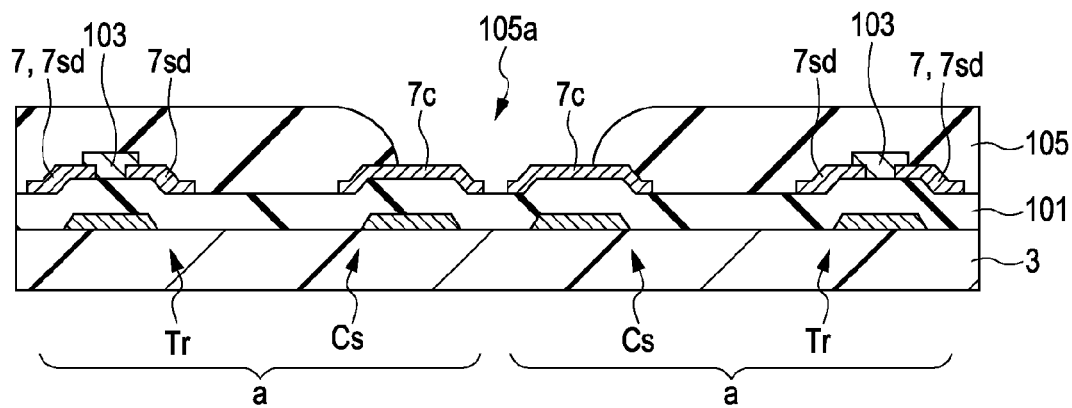
Figure 4C:
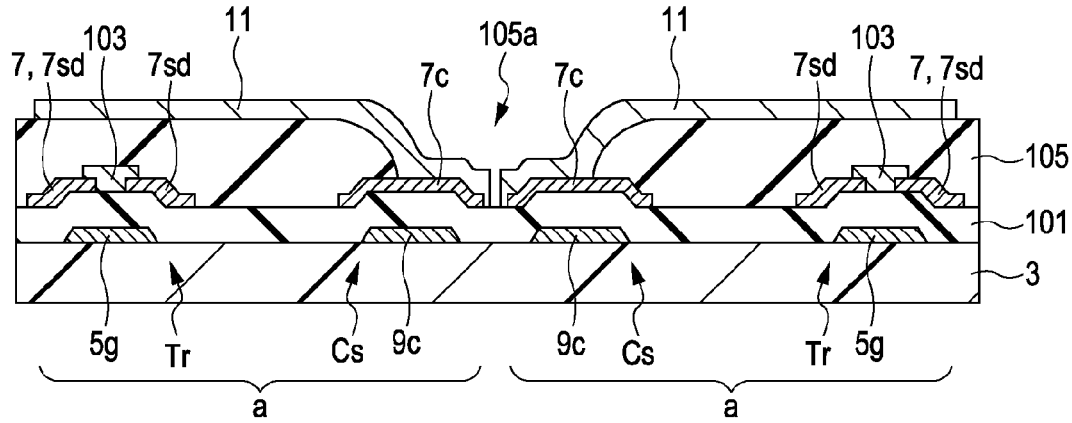

FIGS. 4A to 4C are views each showing a step of manufacturing the above display device 1. These views showing manufacturing steps correspond to cross-sectional views taken along the line IIIA-IIIA in FIG. 2, and hereinafter, with reference to the plan view of FIG. 2 together with FIGS. 4A to 4C, the method for manufacturing the display device 1 will be described. In addition, detailed description of the arrangement shown in FIG. 2 will not be repeated.

First, as shown in FIG. 4A, the drive-side substrate 3 is prepared. As this substrate, a plastic substrate of poly(ether sulfone) (PES) is used. In addition, as the support substrate, for example, there may also be used glass, a metal foil, or a plastic, such as poly(ethylene naphthalate) (PEN), polyimide (PI), polycarbonate (PC), polyacrylate (PAR), poly(ether ether ketone) (PEEK), poly(phenylene sulfide) (PPS), or poly (ethylene terephthalate) (PET).

Next, as the first layer wire, the scanning lines 5, the gate electrodes 5g extended therefrom are pattern-formed, and in addition, the common lines 9 and the lower electrodes 9c of the capacitor elements Cs extended therefrom are pattern-formed.

In this method, for example, a silver ink is applied on the substrate 3 by a die coating, followed by performing a heat treatment at 150° C., so that a conductive film of Ag having a thickness of 50 nm is formed. Subsequently, by a screen printing method, a resist ink is pattern-formed on the conductive film. Next, the conductive film is patterned by wet-etching with a silver etching solution using the printed resist pattern as a mask, so that the above first layer wire is pattern-formed.

As a method for forming a resist pattern used as a mask for etching, for example, an inkjet method, a photolithographic method, or a laser drawing method may be used. In addition, direct patterning by an inkjet method, a screen printing method, a microcontact printing method, or an offset printing method may also be used. However, in order to ensure good insulating properties with respect to upper wires and electrodes to be formed in a subsequent step, the gate electrodes 5g and the like are preferably formed in this step to have a flat surface and to have a thickness as small as possible, such as 100 nm or less.

In addition, as a first layer wire material, besides silver, a metal, such as gold, platinum, palladium, copper, nickel, or aluminum, or a conductive organic material including, for example, poly(3,4-ethylenedioxythiophene)/poly(4-styrenesulfonate) [PEDOT/PSS] or polyaniline (PANI) may also be used.

Next, the gate insulating film 101 covering the first layer wire is formed.

In this step, a cross-linkable high molecular weight material, poly(vinyl phenol) (PVP), is applied, for example, by a die coating method, followed by performing a heat treatment at 150° C., so that the gate insulating film 101 is formed. This gate insulating film 101 is preferably formed to have a surface flatness and a thickness of 1 μm or less since the transistor is operated at a low voltage.

As a method for forming the gate insulating film 101 described above, besides the method described above, for example, a gravure coating method, a roll coating method, a kiss coating method, a knife coating method, a slit coating method, a blade coating method, a spin coating method, or an inkjet method may also be used. In addition, as a material for the gate insulating film 101, besides PVP, for example, polyimide, polyamide, polyester, polyacrylate, poly(vinyl alcohol), an epoxy resin, or a novolac resin may also be used.

Next, on the gate insulating film 101, as a second layer wire, the signal lines 7, the sources and drains 7sd of the thin film transistors Tr, and the upper electrodes 7c of the capacitance elements Cs are pattern-formed.

In this step, first, a silver ink is uniformly applied, for example, by a die coating method, followed by performing a heat treatment at 150° C., so that a conductive film of silver having a thickness of 50 nm is formed. Next, a resist ink is pattern-formed on the conductive film by a screen printing method. Subsequently, the conductive film is patterned by wet-etching with a silver etching solution using the printed resist pattern as a mask, so that the above second layer wire is pattern-formed.

In the formation of the second layer wire, as a method for forming a resist pattern used as a mask for etching, for example, an inkjet method, a photolithographic method, or a laser drawing method may be used. In addition, direct patterning by an inkjet method, a screen printing method, a microcontact printing method, or an offset printing method may also be used as in the case of the formation of the first layer wire.

In this step, as the second layer wire including the source and drain 7sd, besides silver, a metal, such as gold, platinum, palladium, copper, or nickel, which has an excellent ohmic contact with a p-type semiconductor, or a conductive organic material including, for example, poly(3,4-ethylenedioxythiophene)/poly(4-styrenesulfonate) [PEDOT/PSS] or polyaniline (PANI) may also be used.

Next, the semiconductor layer 103 is formed above the gate electrode 5g and between the source 7sd and the drain 7sd of each pixel a. This semiconductor layer 103 is an organic semiconductor layer 103 in this embodiment.

In this step, after a toluene solution containing a pentacene derivative at a concentration of 0.5 percent by weight is applied, for example, by an inkjet method, the solvent was removed by evaporation at 100° C., so that the organic semiconductor layer 103 is formed to have a thickness of 50 nm. Whenever necessary, by using hydrophobic partitions or the like, the organic semiconductor layer 103 can be easily patterned.

In this step, for the organic semiconductor layer 103, besides the above pentacene derivative, a high molecular weight material, such as polythiophene, fluorine-thiophene copolymer, or polyallylamine, or a low molecular weight material, such as pentacene, rubrene, a thiophene oligomer, or a naphthacene derivative, may also be used.

In addition, as a method for forming the organic semiconductor layer 103, besides the above inkjet method, a printing method, such as a spin coating method, a dispenser method, a flexographic printing method, a gravure printing method, or an offset printing method, may also be used. In addition, in the case of a low molecular weight material, the organic semiconductor layer 103 may be pattern-formed by a vacuum deposition method using a shadow mask.

Hereinafter, as shown in FIG. 4B, the interlayer insulating film 105 is formed so as to cover the second layer wire and the organic semiconductor layers 103.

In this step, the interlayer insulating film 105 having the connection holes 105a formed beforehand is pattern-formed by a screen printing method. As shown in the plan view of FIG. 2, in the case in which the pixels each having a size of 170 μm square are formed to be arranged at 150 dpi, first, by using a screen plate having an emulsion pattern of 150 μm square, a resin paste of polyimide is printed. In this step, the emulsion pattern is formed to cover the upper electrodes 7c disposed at the center between the four pixels a as described in the layer structure. Next, the resin paste is fired at 120° C.

As a result, the interlayer insulating film 105 having the connection holes 105a each located on four adjacent pixels a is formed by printing, and the upper electrodes 7c of the four adjacent pixels a are exposed at the bottom portion of each connection hole 105a.

When the emulsion pattern is 150 μm square, since the printed resin paste decreases its viscosity in firing and sags on the substrate 3, the connection holes 105a are each pattern-formed to have a narrowed opening diameter of approximately 110 to 130 μm square. In addition, when a highly fine mesh, such as mesh No. 640 or No. 840, is used in printing, the size of the emulsion pattern can be decreased while the reliability of repeated printing is ensured. Hence, a connection hole having an opening diameter of approximately 100 μm can be formed, and a drive substrate (display backplane) of a highly fine display device of 200 dpi or more can also be formed.

The resin paste used for the above printing, besides that described above, for example, an epoxy resin, a polyester resin, a phenol resin, a urethane resin, or an acrylic resin may also be used; however, in the thin film transistor Tr having a bottom gate structure, since the interlayer insulating film 105 is formed on the organic semiconductor layer 103, a material is preferably selected so that the transistor properties are not degraded by a solvent contained in the resin paste and by a heat treatment performed therefor.

The formation of the interlayer insulating film 105 is not limited to a screen printing method and may be performed by a printing method, such as an inkjet method or a dispenser method.

Subsequently, as shown in FIG. 4C, the pixel electrodes 11 are pattern-formed on the interlayer insulating film 105 so as to be independently connected to the respective upper electrodes 7c at the bottom portions of the connection holes 105a.

In this step, the pixel electrodes 11 are pattern-formed by a screen printing method using a conductive paste. As the conductive paste, for example, a silver paste (such as XA-9024, trade name; manufactured by Fujikura Kasei Co., Ltd.) is used, and after the printing, a heat treatment is performed at 150° C. In this step, since the pixel electrodes 11 are patterned in the connection hole 105a, the connection hole 105a is not filled with the pixel electrodes 11. Hence, connection failure (see Japanese Unexamined Patent Application Publication No. 2001-274547) with the pixel circuit, which occurs after heat curing by air remaining in the connection hole 105a, can be prevented.

As the conductive paste used for forming the pixel electrodes 11 described above, besides a silver paste, a gold paste, a platinum paste, a copper paste, a nickel paste, a palladium paste, or a paste containing an alloy thereof may also be used. In addition, for the formation of the pixel electrodes 11, besides screen printing, direct patterning by an inkjet method, a screen printing method, a microcontact printing method, or an offset printing method may also be used. In addition, as a material for the pixel electrodes 11, depending on the formation method, for example, a metal or a conductive organic material including, for example, poly(3,4-ethylenedioxythiophene)/poly(4-styrenesulfonate) [PEDOT/PSS] or polyaniline (PANI) may be appropriately selected.

Hereinafter, in the case of a liquid crystal display device, an alignment film is formed to cover the pixel electrodes 11, so that the process on the drive-side substrate is completed. Subsequently, between the counter substrate on which the common electrode is covered with an alignment film and the drive substrate thus formed, a liquid crystal layer is provided, so that the display device is obtained.

In addition, in the case of an electrophoretic display device, microcapsules in which charged graphite fine particles and titanium oxide fine particles are dispersed in silicone ions are provided between the drive-side substrate provided with the pixel electrodes 11 and the counter substrate on which the common electrode is provided, so that the display device is obtained.

In the first embodiment thus described, the structure is formed in which the connection holes 105a are provided in the interlayer insulating film 105 formed between the pixel electrodes 11 and the pixel circuits for pixel electrode switching, and in which at the bottom portion of each connection hole 105a, the upper electrodes 7c of the capacitance elements forming pixel circuits of the four pixels a are independently connected to the respective four pixel electrodes 11.

Accordingly, compared to the case in which one connection hole is provided for one connection part between the pixel circuit and the pixel electrode 11, the connection hole 105a can be formed to have a large opening diameter, and the margin of the shape accuracy of the connection hole 105a can be increased. In addition, in the manufacturing of the display device 1 described above, since the connections are formed independently in one connection hole 105a, a method can be used in which after the pixel circuits are formed, the interlayer insulating film 105 having the connection holes 105a therein is formed. Hence, compared to the method in which an interlayer insulating film is formed after via posts to be used as contacts are formed, the interlayer insulating film 105 having a flat surface can be easily obtained even if it has a large thickness.

Accordingly, the interlayer insulating film 105 which has a flat surface even if it has a large thickness and which can dispose thereon connection parts of a top and a bottom layer at a high density can be formed by a printing method, and as a result, a display device capable of performing highly fine display without causing color irregularity can be obtained. In addition, by using only a printing method, a highly fine display device, such as electronic paper, having flexible properties can be manufactured at a low cost.

Second Embodiment

In this embodiment, an active matrix type display device will be described in which a top gate type thin film transistor is used as a switching element of a pixel electrode.

Circuit Structure

The circuit structure of the display device of the second embodiment is similar to that of the first embodiment described with reference to FIG. 1, and description similar to that in the first embodiment will not be repeated.

Layer Structure

Figure 5:
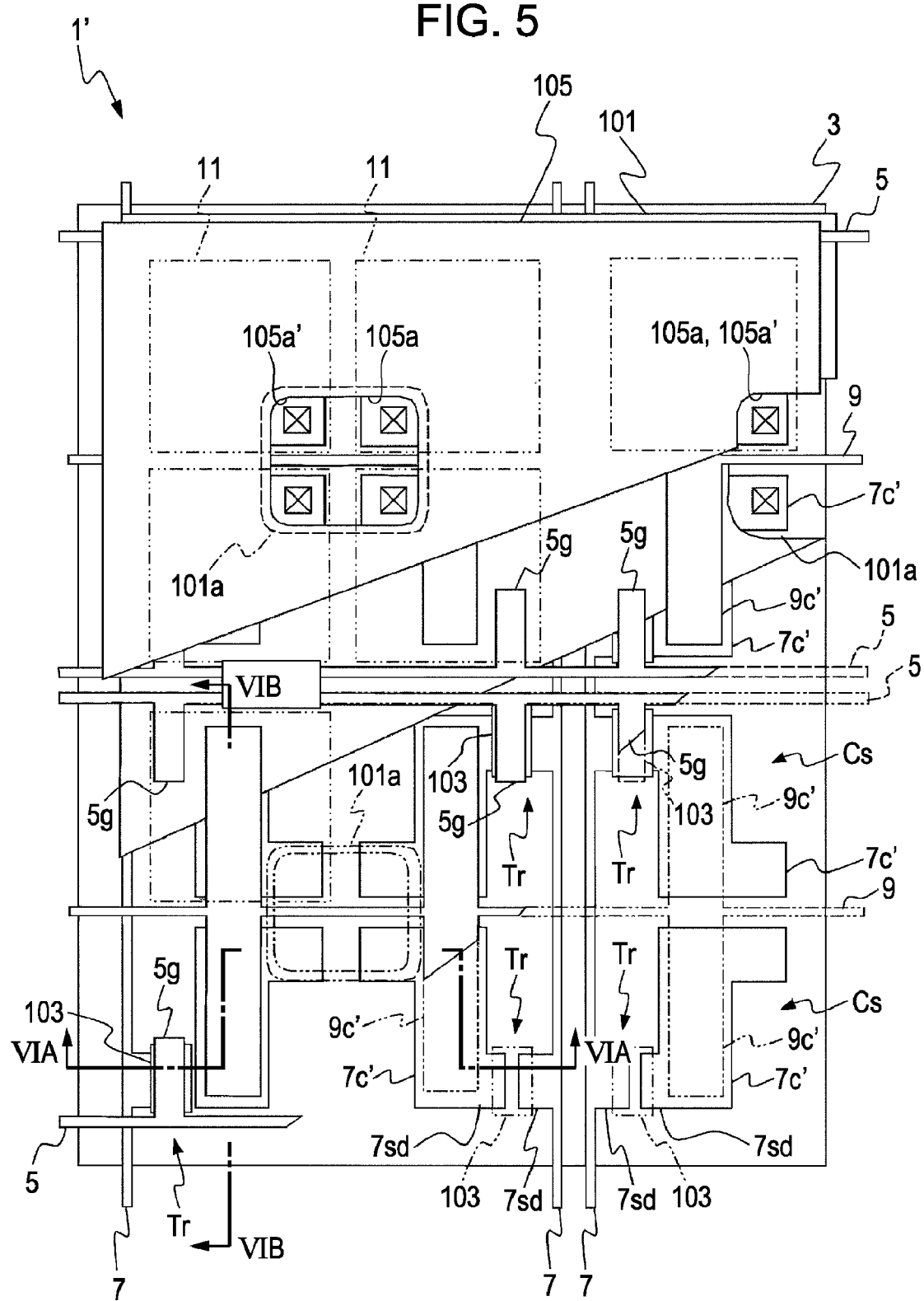
FIG. 5 is a plan view illustrating a layer structure of a display device according to a second embodiment of the present invention.
Figure 6A:
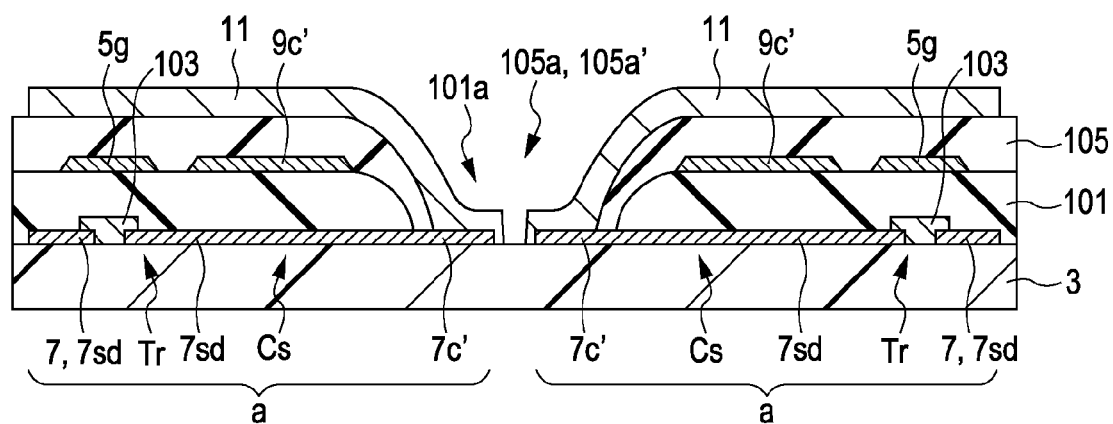
FIGS. 6A and 6B are cross-sectional views each illustrating the layer structure of the display device according to the second embodiment of the present invention.
Figure 6B:
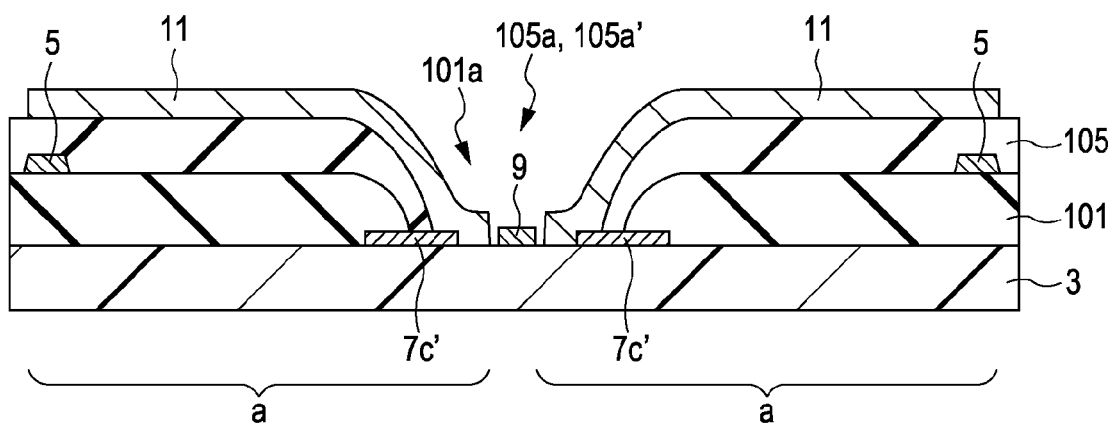

FIG. 5 is a plan view showing important portions of a display device 1' according to the second embodiment, FIG. 6A is a cross-sectional view taken along the line VIA-VIA in FIG. 5, and FIG. 6B is a cross-sectional view taken along the line VIB-VIB in FIG. 5. Hereinafter, with reference to the figures, the layer structure of the display device 1' will be described. In this embodiment, by way of example, a layer structure will be described in which pixels a are designed to have a size of approximately 170 μm square so as to be arranged at 150 dpi.

As shown in those figures, on a first layer provided on the substrate 3 at the drive side, the signal lines 7, the sources and drains 7sd of the thin film transistors Tr, and the lower electrodes 7c' of the capacitance elements Cs are provided. One of the source 7sd and the drain 7sd of the thin film transistor Tr of each pixel a portion is extended from the signal line 7. In addition, the remaining source or drain 7sd and the lower electrode 7c' form a continuous pattern in each pixel a portion.

In this embodiment, one of the source 7sd and the drain 7sd, which is extended from the signal line 7, is extended toward the inside between two signal lines 7. On the other hand, at a place between two signal lines 7, the remaining source or drain 7sd forming a continuous pattern with the lower electrode 7c' is to be connected to a central portion between four pixels a which use one common line 9 to be described later. The continuous pattern of the lower electrode 7c' and the remaining source or drain 7sd is a connection portion with the pixel electrode 11 which will be described later.

In addition, between the source 7sd and the drain 7sd of each pixel a, the semiconductor layer 103 to be used as an active region of the thin film transistor Tr is provided.

The gate insulating film 101 is provided so as to cover the signal lines 7, the sources 7sd and the drains 7sd, the lower electrodes 7c', and the semiconductor layers 103. This gate insulating film 101 is one interlayer insulating film disposed between the pixel electrodes 11, which will be described later, and the continuous patterns, which are connected thereto, each formed of the lower electrode 7c' and the remaining source or drain 7sd.

In particular, connection holes 101a each located on four pixels a are provided in this gate insulating film 101. At the bottom portion of each connection hole 101a, as described above, the four lower electrodes 7c', which are disposed at the central portion between the four pixels a and which use the same common line 9, are exposed as parts of adjacent pixel circuits between two signal lines 7. That is, in one connection hole 101a, the lower electrodes 7c forming the pixel circuits of the four pixels a are exposed.

As a second layer provided on this gate insulating film 101, the scanning lines 5 and the common lines 9 are disposed parallel to each other. These lines 5 and 9 form a plurality of sets each including three lines, that is, two scanning lines 5 and one common line 9 disposed therebetween.

In each pixel a portion, the gate electrode 5g of the thin film transistor Tr is extended from each scanning line to the common line 9 side. In addition, upper electrodes 9c' of the capacitance elements Cs of individual pixel a portions are extended from each common line 9 to two scanning lines 5 located at the two sides thereof. That is, from one common line 9, the upper electrodes 9c' are extended to two pixels a provided between the two scanning lines 5.

The second layer, that is, the scanning lines 5, the gate electrodes 5g, and the upper electrodes 9c' are disposed on the gate insulating film 101. In addition, at the bottom portions of the connection holes 101a provided in the gate insulating film 101, the common lines 9 are disposed at places so as to be insulated from the lower electrodes 7c'.

In each pixel circuit formed of the capacitance element Cs and the thin film transistor Tr as described above, the lower electrode 7c' of the capacitance element Cs and the remaining source or drain 7sd, which are provided as a continuous pattern, form the connection portion with the pixel electrode 11. In addition, this connection portion is disposed at the central portion between the above four pixels a.

In addition, the interlayer insulating film 105 is provided so as to cover the pixel circuits described above. This interlayer insulating film 105 is preferably formed to have a flat surface and a large thickness so as not to generate a parasite capacitance between the pixel circuit and the pixel electrode formed thereabove.

In particular, the connection holes 105a each located on four pixels a are provided in the interlayer insulating film 105 so as to be overlapped with the connection holes 101a formed in the gate insulating film 101. Hereinafter, a portion at which the connection hole 105a and the connection hole 101a are overlapped with each other is called a connection hole 105a'. At the bottom portion of each connection hole 105a', as described above, as parts of adjacent pixel circuits, the four lower electrodes 7c' disposed at the central portion between the four pixels a are exposed. That is, in one connection hole 105a', the four lower electrodes 7c' forming pixel circuits of the four pixel a are exposed.

The common lines 9 may be exposed through the connection holes 105a'; however, in this embodiment, the connection holes 105a' are each formed such that the upper electrode 9c' is not exposed, and the lower electrodes 7c' are each exposed at the opening bottom portion to have a sufficient area for reliable connection. For example, in this embodiment in which the pixels a are designed to have a size of approximately 170 μm square, the opening may have a diameter of approximately 110 to 130 μm.

In addition, as a third layer provided on this interlayer insulating film 105, the pixel electrodes 11 are formed and arranged. One pixel electrode 11 is directly connected to the corresponding lower electrode 7c' forming the pixel circuit at the bottom portion of the connection hole 105a'. Hence, in one connection hole 105a', end portions of four pixel electrodes 11 are directly connected to respective lower electrodes 7c'.

For example, in the case of a liquid crystal display device, the pixel electrodes 11 as described above are covered with an alignment film which is not shown in the figures.

In addition, a counter substrate (not shown in the figures) is provided at one side of the drive-side substrate 3 at which the pixel electrodes 11 are formed. On a surface of the counter substrate facing the pixel electrodes 11, a common electrode is provided. In addition, for example, in the case of a liquid crystal display device, an alignment film is provided to cover the common electrode, and between the pixel electrodes 11 and the common electrode provided on the two substrates, a liquid crystal layer is provided with the alignment films in contact therewith. In addition, in the case of an electrophoretic display device, between the pixel electrodes 11 and the common electrode, microcapsules in which charged graphite fine particles and titanium oxide fine particles are dispersed in silicone ions are provided.

Manufacturing Method

FIGS. 7A to 7D are views each showing a step of manufacturing the above display device 1'. These views showing manufacturing steps correspond to cross-sectional views taken along the line VIA-VIA in FIG. 5, and hereinafter, with reference to the plan view of FIG. 5 together with FIGS. 7A to 7D, the method for manufacturing the display device 1' will be described. In addition, detailed description of the arrangement shown in FIG. 5 will not be repeated.

Figure 7A:
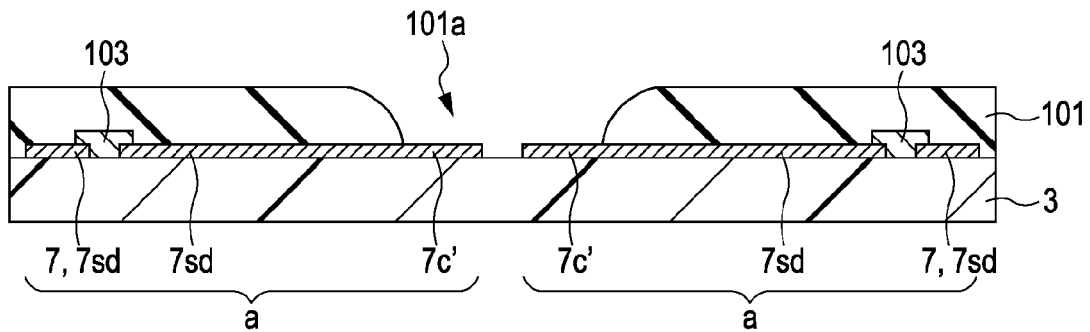
FIGS. 7A to 7D are cross-sectional views each illustrating a manufacturing step of the display device according to the second embodiment of the present invention.

First, as shown in FIG. 7A, the drive-side substrate 3 is prepared. As this substrate, as the case of the first embodiment, a plastic substrate of a poly(ether sulfone) (PES) is used. In addition, as the support substrate, for example, there may be used glass, a metal foil, or a plastic, such as poly(ethylene naphthalate) (PEN), polyimide (PI), polycarbonate (PC), polyacrylate (PAR), poly(ether ether ketone) (PEEK), poly(phenylene sulfide) (PPS), or poly(ethylene terephthalate) (PET).

Next, as the first layer wire, the signal lines 7, the sources and drains 7sd of the thin film transistors Tr, and the lower electrodes 7c' of the capacitance elements Cs are pattern-formed.

In this method, a silver ink is applied on the substrate 3, for example, by a die coating, followed by performing a heat treatment at 150° C., so that a conductive film of Ag having a thickness of 50 nm is formed. Subsequently, by a screen printing method, a resist ink is pattern-formed on the conductive film. Next, the conductive film is patterned by wet-etching with a silver etching solution using the printed resist pattern as a mask, so that the above first layer wire is pattern-formed.

In the formation of the first layer wire, as a method for forming a resist pattern used as a mask for etching, for example, an inkjet method, a photolithographic method, or a laser drawing method may be used. In addition, direct patterning by an inkjet method, a screen printing method, a microcontact printing method, or an offset printing method may also be used.

In addition, as a first layer wire material, besides silver, a metal, such as gold, platinum, palladium, copper, or nickel, which has an excellent ohmic contact with a p-type semiconductor, or a conductive organic material including, for example, poly(3,4-ethylenedioxythiophene)/poly(4-styrenesulfonate) [PEDOT/PSS] or polyaniline (PANI) may also be used.

Next, the semiconductor layer 103 is pattern-formed between the source 7sd and the drain 7sd in each pixel a.

In this step, after a toluene solution containing a pentacene derivative at a concentration of 0.5 percent by weight is applied, for example, by an inkjet method, the solvent was removed by evaporation at 100° C., so that the organic semiconductor layer 103 is formed to have a thickness of 50 nm. Whenever necessary, by using hydrophobic partitions or the like, the organic semiconductor layer 103 can be easily patterned.

In this step, as the organic semiconductor layer 103, besides the above pentacene derivative, a high molecular weight material, such as polythiophene, fluorine-thiophene copolymer, or polyallylamine, or a low molecular weight material, such as pentacene, rubrene, a thiophene oligomer, or a naphthacene derivative, may also be used.

In addition, as a method for forming the organic semiconductor layer 103, besides the above inkjet method, a printing method, such as a spin coating method, a dispenser method, a flexographic printing method, a gravure printing method, or an offset printing method, may also be used. In addition, in the case of a low molecular weight material, the organic semiconductor layer 103 may be pattern-formed by a vacuum deposition method using a shadow mask.

Next, the gate insulating film 101 is formed so as to cover the first layer wire and the organic semiconductor layers 103.

In this step, a cross-linkable high molecular weight material, poly(vinyl phenol) (PVP), is applied, for example, by a screen printing method to form a film having the connection holes 101a exposing the lower electrodes 7c', followed by performing a heat treatment at 150° C., so that the gate insulating film 101 is formed. In this step, the connection holes 101a are each formed to be located on four pixels a and to expose the four lower electrodes 7c' thereof. In addition, a screen plate is designed so that the opening diameter of the connection hole 101a is larger than that of the connection hole of the interlayer insulating film to be formed in a subsequent step. For example, in the case in which pixels are designed to have a size of 170 μm square to be arranged at 150 dpi, a screen plate having an emulsion pattern of 170 μm square is used.

This gate insulating film 101 is preferably formed to have a surface flatness and a thickness of 1 μm or less since the transistor is operated at a low voltage.

As a material forming the gate insulating film 101 as described above, besides PVP, for example, polyimide, polyamide, polyester, polyacrylate, poly(vinyl alcohol), an epoxy resin, a novolac resin, or a fluorinated resin may also be used. In addition, as a method for forming the gate insulating film 101 as described above, besides a screen printing method, for example, a gravure printing method, an offset printing method, an inkjet method, or a dispenser method may also be used.

Figure 7B:
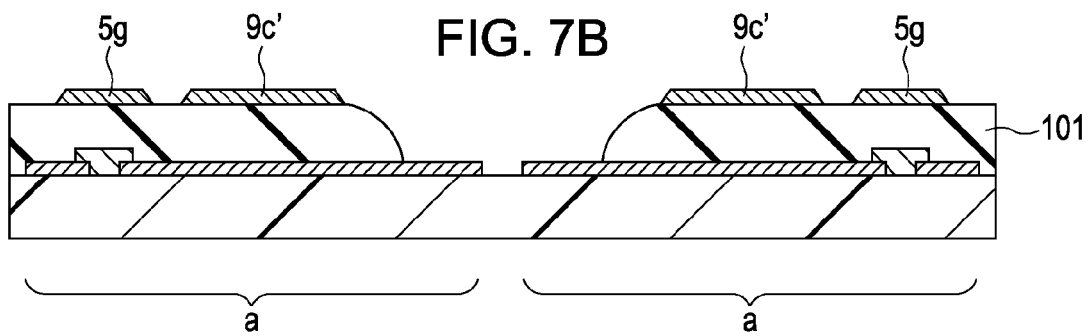

Next, as shown in FIG. 7B, on the gate insulating film 101, as a second layer wire, the scanning lines 5, the gate electrodes 5g extended therefrom, the common lines 9, and the upper electrodes 9c' of the capacitance elements Cs extended therefrom are pattern-formed.

In this step, first, a silver ink is applied, for example, by a die coating method, followed by performing a heat treatment at 150° C., so that a conductive film of silver having a thickness of 50 nm is formed. Next, a resist ink is pattern-formed on the conductive film by a screen printing method. Subsequently, the conductive film is patterned by wet-etching with a silver etching solution using the printed resist pattern as a mask, so that the above second layer wire is pattern-formed.

As a method for forming a resist pattern used as a mask for etching, for example, an inkjet method, a photolithographic method, or a laser drawing method may be used. In addition, direct patterning by an inkjet method, a screen printing method, a microcontact printing method, or an offset printing method may also be used. However, in order to ensure good insulating properties with respect to upper wires and electrodes to be formed in a subsequent step, the gate electrodes 5g and the like are preferably formed in this step to have a flat surface and a thickness as small as possible, such as 100 nm or less.

In addition, as a second layer wire material, besides silver, a metal, such as gold, platinum, palladium, copper, nickel, or aluminum, or a conductive organic material including, for example, poly(3,4-ethylenedioxythiophene)/poly(4-styrenesulfonate) [PEDOT/PSS] or polyaniline (PANI) may also be used.

Figure 7C:
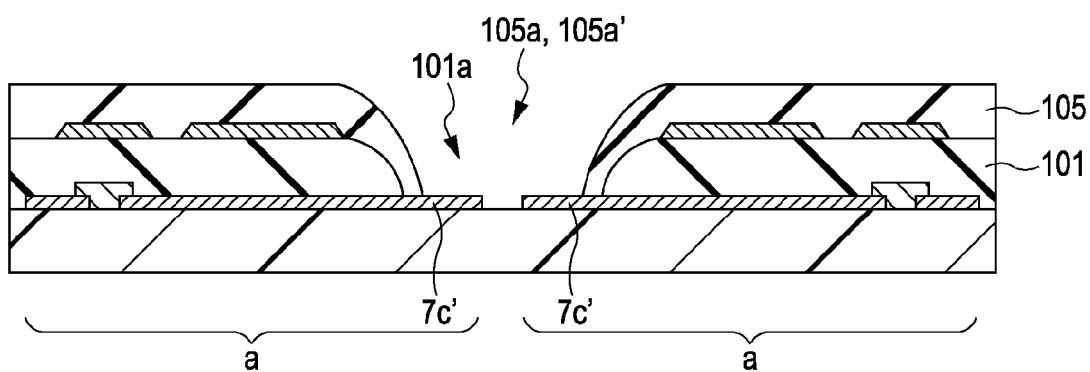

Next, as shown in FIG. 7C, the interlayer insulating film 105 is formed so as to cover the second layer wire.

In this step, the interlayer insulating film 105 provided beforehand with the connection holes 105a is pattern-formed by a screen printing method. As shown in the plan view of FIG. 5, in the case in which the pixels are designed to have a size of 170 μm square to be arranged at 150 dpi, first, by using a screen plate having an emulsion pattern of 150 μm square, a resin paste of polyimide is printed. In this step, as described in the layer structure, the emulsion pattern is formed to cover the lower electrodes 7c' disposed at the central portion between the four pixels a. Next, the resin paste is fired at 120° C.

As a result, the interlayer insulating film 105 having the connection holes 105a each located on four pixels a is formed by printing, and the lower electrodes 7c' of the four pixels a are exposed at the bottom portion of each connection hole 105a' at which the connection hole 105a and the connection hole 101a of the gate insulating film 101 are overlapped with each other.

When the emulsion pattern is 150 μm square, since the printed resin paste decreases its viscosity in firing and sags on the substrate 3, the connection holes 105a are each pattern-formed to have a narrowed opening diameter of approximately 110 to 130 μm square. In addition, when a highly fine mesh, such as mesh No. 640 or No. 840, is used in printing, the size of the emulsion pattern can be decreased while the reliability of repeated printing is ensured. Hence, a connection hole having an opening diameter of approximately 100 μm can be formed, and a drive substrate (display backplane) of a highly fine display device of 200 dpi or more can also be formed.

The resin paste used for the above printing, besides that described above, for example, an epoxy resin, a polyester resin, a phenol resin, a urethane resin, or an acrylic resin may also be used.

The formation of the interlayer insulating film 105 is not limited to a screen printing method and may be performed by a printing method, such as an inkjet method or a dispenser method.

Figure 7D:
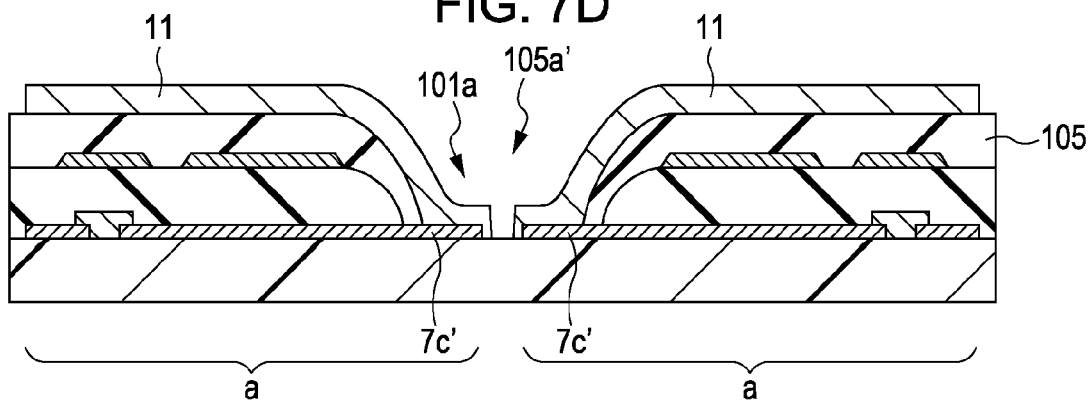

Subsequently, as shown in FIG. 7D, the pixel electrodes 11 are pattern-formed on the interlayer insulating film 105 so as to be independently connected to the respective lower electrodes 7c' at the bottom portions of the connection holes 105a'.

In this step, the pixel electrodes 11 are pattern-formed by a screen printing method using a conductive paste. As the conductive paste, for example, a silver paste (such as XA-9024, trade name; manufactured by Fujikura Kasei Co., Ltd.) is used, and after the printing, a heat treatment is performed at 150° C. In this step, since the pixel electrodes 11 are patterned in the connection hole 105a', the connection hole 105a' is not filled with the pixel electrodes 11. Hence, connection failure (see Japanese Unexamined Patent Application Publication No. 2001-274547) with the pixel circuit, which occurs after heat curing by air remaining in the connection hole 105a', can be prevented.

As a conductive paste used for forming the pixel electrodes 11 as described above, besides a silver paste, a gold paste, a platinum paste, a copper paste, a nickel paste, a palladium paste, or a paste containing an alloy thereof may be used. In addition, for the formation of the pixel electrodes 11, besides screen printing, direct patterning by an inkjet method, a screen printing method, a microcontact printing method, or an offset printing method may also be used. In addition, as a material for the pixel electrodes 11, depending on the formation method, for example, a metal or a conductive organic material including, for example, poly(3,4-ethylenedioxythiophene)/poly(4-styrenesulfonate) [PEDOT/PSS] or polyaniline (PANI) may be appropriately selected.

Hereinafter, in the case of a liquid crystal display device, an alignment film is formed to cover the pixel electrodes 11, so that the process on the drive-side substrate is completed. Subsequently, between the counter electrode on which the common electrode is covered with an alignment film and the drive substrate thus formed, a liquid crystal layer is provided, so that the display device is obtained.

In addition, in the case of an electrophoretic display device, microcapsules in which charged graphite fine particles and titanium oxide fine particles are dispersed in silicone ions are provided between the drive-side substrate provided with the pixel electrodes 11 and the counter substrate provided with the common electrode, so that the display device is obtained.

In the second embodiment thus described, the structure is formed in which the connection holes 105*a'* are provided in the interlayer insulating film 105 and the gate insulating film 101, which are formed between the pixel electrodes 11 and the pixel circuits for pixel electrode switching, and in which at the bottom portion of each connection hole 105*a'*, the lower electrodes 7*c'* of the capacitance elements Cs forming pixel circuits of the four pixels a are independently connected to the respective four pixel electrodes 11.

Accordingly, as the first embodiment, compared to the case in which one connection hole is provided for one connection part formed between a pixel circuit and a corresponding pixel electrode 11, the connection hole 105*a'* can be formed to have a large opening diameter, and the margin of the shape accuracy of the connection hole 105*a'* can be increased. In addition, in the manufacturing of the display device 1' as described above, since the connections are formed independently in one connection hole 105*a'*, a method can be used in which after the pixel circuits are formed, the interlayer insulating film 105 having the connection holes 105*a* therein is formed. Hence, compared to the method in which an interlayer insulating film is formed after via posts to be used as contacts are formed, the interlayer insulating film 105 having a flat surface can be easily obtained even if it has a large thickness.

Accordingly, as the first embodiment, the interlayer insulating film 105, which has a flat surface even if it has a large thickness and which can dispose thereon connection parts of a top and a bottom layer at a high density, can be formed by a printing method, and as a result, a display device capable of performing highly fine display without causing color irregularity can be obtained. In addition, by using only a printing method, a highly fine display device, such as electronic paper, having flexible properties can be manufactured at a low cost.

In addition, in the second embodiment, since the top gate type thin film transistor Tr is used as a switching element of the pixel electrode 11, the semiconductor layer 103 is shielded from the pixel electrode 11 by the gate electrode 5*g*. Hence, a channel region formed in the semiconductor layer 103 is prevented from being influenced by a potential of the pixel electrode 11, and unintentional threshold voltage shift of the transistor can be suppressed, and hence stable display can be performed.

In the above first and the second embodiments described above, the structure is described in which four pixels adjacent to each other in the scanning line 5 direction and the signal line 7 direction commonly use one connection hole. However, according to the present invention, two pixels disposed adjacent in one of the above two directions may commonly use one connection hole, and in this case, an effect similar to that described above can also be obtained. For example, when two pixels disposed adjacent in the scanning line 5 direction commonly use one connection hole, these two pixels are arranged in line symmetry with respect to the signal line 7. On the other hand, when two pixels disposed adjacent in the signal line 7 direction commonly use one connection hole, these two pixels are arranged in line symmetry with respect to the scanning line 5 and can commonly use one common line 9.

In addition, in the first and the second embodiments, the process is described which uses a printing method for forming the interlayer insulating film 105 provided with the connection holes 105*a* therein. However, even by a process in which after an interlayer insulating film is formed, connection holes are formed therein, an effect of increasing the margin of the shape accuracy of the connection hole can also be obtained.

In addition, in the above first and the second embodiments, the liquid crystal display device and the electrophoretic display device are described by way of example. However, the present invention can be widely applied to an active matrix type display device which includes pixel circuits for pixel electrode switching, an interlayer insulating film covering the pixel circuits, and pixel electrodes provided on the interlayer insulating film. As another example of the display device described above, a display device in which organic electroluminescent elements are arranged may be mentioned by way of example.

In this display device, pixel circuits are each formed of at least two thin film transistors and a capacitor element. In addition, pixel electrodes are formed on an interlayer insulating film covering the pixel circuits and are connected thereto via connection holes, and a common electrode layer is provided on the pixel electrodes with an organic light-emitting layer interposed therebetween. In the structure as described above, when the pixel circuits are independently connected to the respective pixel electrodes in each of the connection holes provided in the interlayer insulating film as that described in the above embodiments, an effect similar to that described therein can also be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. A display device comprising:
   a substrate;
   a plurality of pixels, each pixel including a pixel circuit for pixel electrode switching, the pixels arranged on the substrate;
   an interlayer insulating film covering the pixel circuits;
   connection holes in the interlayer insulating film facing the pixel circuits; and
   a plurality of pixel electrodes on the interlayer insulating film, each one of said pixel electrodes is connected to a respective pixel electrode circuit within the connection holes, wherein,
   connection portions are formed where each one of said pixel electrodes and its respective pixel circuit connect, and
   at least two of the connection portions are located within one of the connection holes.

2. The display device according to claim 1, wherein the connection portions of four adjacent pixel circuits form a center of the four adjacent pixel circuits and the center of the four adjacent pixel circuits is located within one connection hole.

3. The display device according to claim 1, further comprising:
- a plurality of scanning lines arranged in a horizontal direction; and
- a plurality of signal lines arranged in a vertical direction, wherein,
- the pixel circuits are disposed at the points of intersection between the scanning lines and the signal lines,
- the adjacent pixel circuits disposed in the scanning line direction are arranged in line symmetry with respect to the signal lines, and
- the connection portions of adjacent pixel circuits are within connection holes disposed in the scanning line direction.

4. The display device according to claim 1, further comprising:
- a plurality of scanning lines arranged in a horizontal direction; and
- a plurality of signal lines arranged in a vertical direction, wherein,
- the pixel circuits are disposed at the points of intersection between the scanning lines and the signal lines,
- the adjacent pixel circuits disposed in the signal line direction are arranged in line symmetry with respect to the scanning lines, and
- the connection portions of adjacent pixel circuits are within connection holes disposed in the signal line direction.

5. The display device according to claim 1, further comprising:
- a plurality of scanning lines arranged in a horizontal direction; and
- a plurality of signal lines arranged in a vertical direction, wherein,
- the pixel circuits are disposed at the points of intersection between the scanning lines and the signal lines,
- the adjacent pixel circuits disposed in the scanning line direction are arranged in line symmetry with respect to the signal lines,
- the adjacent pixel circuits disposed in the signal line direction are arranged in line symmetry with respect to the scanning lines, and
- the connection portions of adjacent pixel circuits are within connection holes disposed in the scanning line direction.

6. The display device according to claim 4 or 5, further comprising common lines connected to the pixel circuits, wherein the common lines are each commonly used by two adjacent pixel circuits disposed between two scanning lines.

7. The display device according to claim 1, wherein the interlayer insulating film comprises an organic material.

8. A display device comprising:
- a substrate;
- a plurality of pixels, each pixel including a pixel circuit for pixel electrode switching, the pixels arranged on the substrate;
- an interlayer insulating film covering the pixel circuits;
- connection holes in the interlayer insulating film facing the pixel circuits; and
- a plurality of pixel electrodes on the interlayer insulating film, each one of said pixel electrodes is connected to a respective pixel electrode circuit within the connection holes, wherein,
- connection portions are formed where each one of said pixel electrodes and its respective pixel circuit connect,
- the connection portions of four adjacent pixel circuits form a center of the four adjacent pixel circuits, and
- the center of the four adjacent pixel circuits is located within one connection hole.

* * * * *